US012596160B2

(12) United States Patent
Yuan et al.

(10) Patent No.: US 12,596,160 B2
(45) Date of Patent: Apr. 7, 2026

(54) MAGNETIC SENSING DEVICE AND MAGNETIC SENSING METHOD

(71) Applicants: SUZHOU NOVOSENSE MICROELECTRONICS CO., LTD., Suzhou (CN); AUMOVIO Automotive System Changchun Co., Ltd., Changchun (CN)

(72) Inventors: FuTe Yuan, Suzhou (CN); Yun Sheng, Suzhou (CN); Jia Zhao, Suzhou (CN); Jian Ye, Suzhou (CN); Peng Zhao, Suzhou (CN); Fu Zhang, Changchun (CN); Yanxia Guo, Changchun (CN); Hongjun Jiang, Changchun (CN); Robert Franz Wilhelm Axel Meyer, Essen (DE); Tillmann Krauss, Frankfurt am Main (DE); Ralf Endres, Frankfurt am Main (DE); Mario Trott, Frankfurt am Main (DE)

(73) Assignees: SUZHOU NOVOSENSE MICROELECTRONICS CO., LTD., Suzhou (CN); AUMOVIO Automotive System Changchun Co., Ltd., Changchun (CN)

( * ) Notice: Subject to any disclaimer, the term of this patent is extended or adjusted under 35 U.S.C. 154(b) by 180 days.

(21) Appl. No.: 18/501,204

(22) Filed: Nov. 3, 2023

(65) Prior Publication Data

US 2024/0151783 A1 May 9, 2024

(30) Foreign Application Priority Data

Nov. 4, 2022 (CN) .......................... 202211379588.7
Dec. 7, 2022 (CN) .......................... 202211559929.9

(51) Int. Cl.
*G01R 33/06* (2006.01)

(52) U.S. Cl.
CPC ................................... *G01R 33/06* (2013.01)

(58) Field of Classification Search
CPC ...................................................... G01R 33/06
See application file for complete search history.

(56) References Cited

U.S. PATENT DOCUMENTS 4,490,674 A * 12/1984 Ito .......................... G01D 5/145
324/252
8,102,175 B2 1/2012 Rossler et al.
(Continued)

FOREIGN PATENT DOCUMENTS

CN 105222812 A 1/2016
CN 109270474 A 1/2019
(Continued)

OTHER PUBLICATIONS

Chinese Office Action issued in corresponding Chinese Patent Application No. 202211559929.9 dated Feb. 20, 2025, pp. 1-11.
(Continued)

*Primary Examiner* — Reena Aurora
(74) *Attorney, Agent, or Firm* — PV IP PC; Peter S. Stecher; Wei Te Chung

(57) ABSTRACT

A magnetic sensing device including a substrate having a supporting surface on which a first sensing area, a third sensing area, and a second sensing area are consecutively arranged in a direction of movement. The first, the second, and the third sensing areas are provided with a first midline, a second midline, and a third midline in the direction of movement, respectively. The first and second midlines are symmetrical with respect to the third midline. The first and second sensing areas are jointly configured to output a first output signal. The third sensing area is configured to output a second output signal. A phase difference between the first and second output signals is 90 degrees, and the first and second output signals are jointly configured to determine the (Continued)

distance or the speed or the angle of movement and the direction of movement of the relative motion.

10 Claims, 7 Drawing Sheets

(56)  References Cited

U.S. PATENT DOCUMENTS

| | | | |
|---|---|---|---|
| 9,891,074 B2 * | 2/2018 | Meyer | G01D 5/14 |
| 2006/0043963 A1 * | 3/2006 | Kaneyasu | G01D 5/145 |
| | | | 324/179 |
| 2015/0377646 A1 | 12/2015 | Meyer et al. | |
| 2017/0336229 A1 | 11/2017 | Watanabe et al. | |
| 2018/0216963 A1 | 8/2018 | Uberti et al. | |
| 2018/0283905 A1 | 10/2018 | Werth et al. | |
| 2020/0158535 A1 | 5/2020 | Fontanesi et al. | |
| 2020/0300943 A1 * | 9/2020 | Yuan | G01R 33/0017 |
| 2022/0136865 A1 | 5/2022 | Schroers et al. | |
| 2022/0333953 A1 | 10/2022 | Umehara et al. | |

FOREIGN PATENT DOCUMENTS

| | | | |
|---|---|---|---|
| CN | 110662939 A | 1/2020 | |
| CN | 114593668 A | 6/2022 | |
| CN | 115265605 A | 11/2022 | |
| WO | 0125719 A1 | 4/2001 | |

OTHER PUBLICATIONS

European Extended Search Report issued in corresponding European Patent Application No. 23207774.3 dated Apr. 2, 2024.

* cited by examiner

MAGNETIC SENSING DEVICE AND MAGNETIC SENSING METHOD

CROSS-REFERENCE TO RELATED APPLICATION

This application claims the priority to Chinese Patent Application No. 202211559929.9, filed on Dec. 7, 2022, which claims the priority to Chinese Patent Application No. 202211379588.7, filed on Nov. 4, 2022, the contents of both patent applications are incorporated herein by reference in their entirety.

TECHNICAL FIELD

The present disclosure relates to the field of sensor technologies, and more particularly, to a magnetic sensing device and a magnetic sensing method.

BACKGROUND

Measuring an angle of rotation of an object, such as a gear or a shaft of rotation of a mechanical device; or measuring position and movement information of a moving object, such as an on-off stroke of a valve, plays an important role in the industrial, automotive, and even commercial fields. The measuring can realize monitoring and alarm of various systems, such as idle slip, various automatic action feedback control, such as action or attitude control, or triggering of various operations, such as brake slip or seat belt warning. In the above-mentioned application fields, various measurements are mostly realized by magnetic sensing, because the magnetic sensing has the characteristics of non-contact measurement, excellent vibration resistance and oil stain resistance, and can provide advantages such as sufficient accuracy and reaction speed. However, researchers have found that the conventional magnetic sensing device can accurately output a result at a generally low magnetic field intensity, such as 50G or less; however, in a scenario in which the magnetic field intensity is high, for example, 50G or more, the output result may be abnormal, in particular when the magnetic field intensity is 700G or 1000G or more, the output result may be substantially erroneous. In practical applications, the magnetic field intensity of a scene to be measured is usually higher than or equal to 600G, Therefore, there is a need for a sensing device that can accommodate applications in Which scenes to be measured have high magnetic field intensity.

SUMMARY

According to an aspect of the present disclosure, a magnetic sensing device is provided. The magnetic sensing device has a relative motion relationship with an object in a direction of movement. The object has a magnetic field to be measured thereon. The magnetic sensing device is configured to sense a distance or a speed or an angle of movement and a direction of movement of the relative motion. The magnetic sensing device includes the following.

A substrate having a supporting surface being parallel to the direction of movement on which a first sensing area, a third sensing area, and a second sensing area being consecutively arranged in the direction of movement, the first sensing area, the second sensing area, and the third sensing area respectively having a first midline, a second midline, and a third midline in the direction of movement, the first midline, the second midline, and the third midline respectively-passing through midpoints of projection lengths of the first sensing area, the second sensing area, and the third sensing area in the direction of movement and being perpendicular to the direction of movement, and the first midline and the second midline being symmetrical with respect to the third midline.

The first sensing area and the second sensing area are jointly configured to output a first output signal. The third sensing area is configured to output a second output signal. A phase difference between the first output signal and the second output signal is 90 degrees, and the first output signal and the second output signal are jointly configured to determine the distance or the speed or the angle of movement and the direction of movement of the relative motion.

According to another aspect of the present disclosure, a magnetic sensing method for determining a distance or a speed or an angle of movement and a direction of movement of a relative motion between a magnetic sensing device and an object is provided. The magnetic sensing device and the object have a relative motion relationship along the direction of movement. The object has a magnetic field to be measured thereon. The magnetic sensing device employs the magnetic sensing device as described above. The magnetic sensing method includes the following.

Acquiring a first output signal jointly by a first sensing area and a second sensing area, acquiring a second output signal by a third sensing area, where a phase difference between the first output signal and the second output signal is 90 degrees, and determining the distance or the speed or the angle of movement and the direction of movement of the relative motion according to the first output signal and the second output signal.

BRIEF DESCRIPTION OF THE DRAWINGS

The drawings described herein are for illustrative purposes only and are not intended to limit the scope of the disclosure in any way. In addition, the shapes, scale sizes, and the like of the components in the figures are merely illustrative and are intended to facilitate understanding of the present disclosure, and are not intended to specifically limit the shapes and scale sizes of the components of the present disclosure. Those skilled in the art, in light of the teachings of the present disclosure, may select various possible shapes and scale sizes to implement the present disclosure, depending on the specific circumstances. In the drawings.

DETAILED DESCRIPTION

Figure 1:
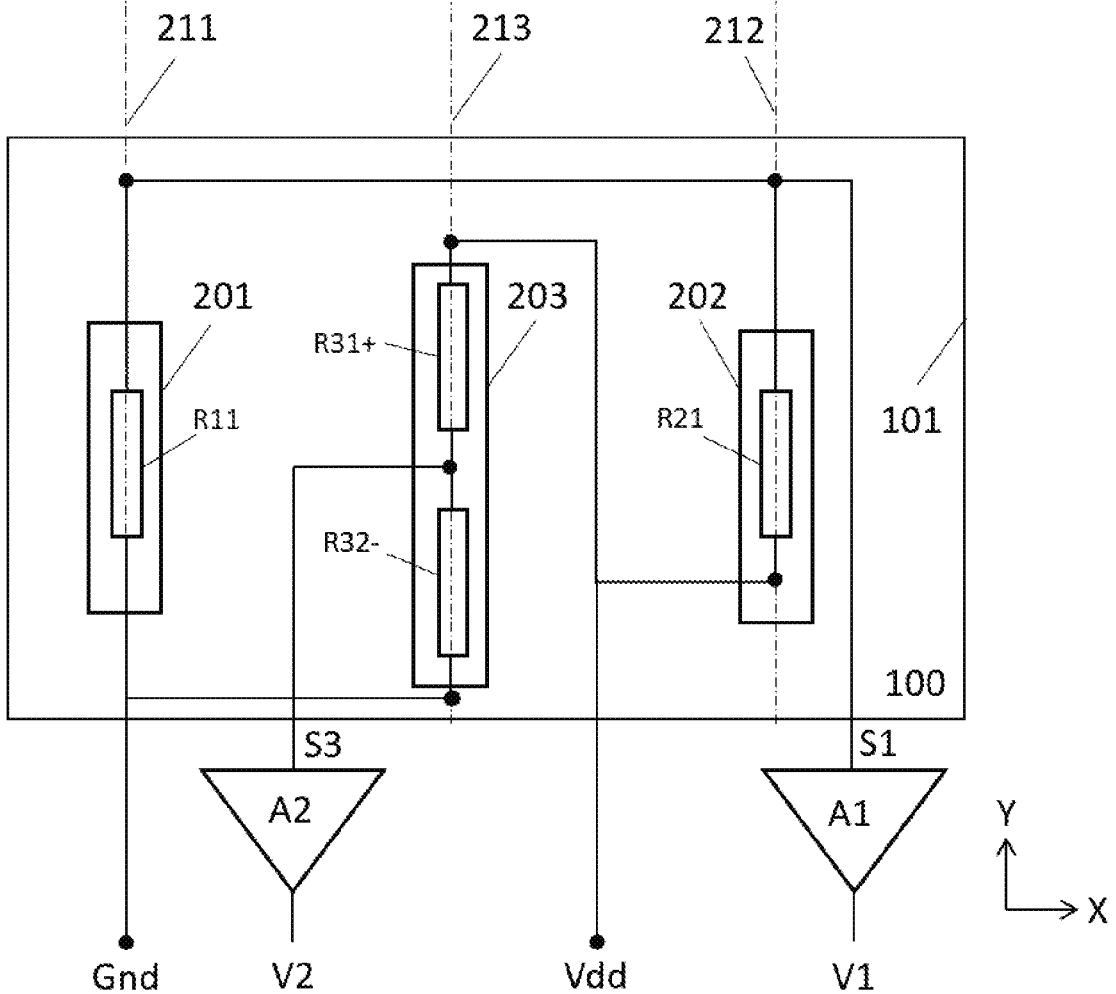
FIG. 1 is a schematic structural diagram of a first embodiment of a magnetic sensing device according to a first implementation of the present disclosure.

In order that the technical solution in the present disclosure may be better understood by those skilled in the art, the technical solution in the embodiments of the present disclosure will be clearly and completely described with reference to the accompanying drawings in the embodiments of the present disclosure. Obviously, the described embodiments are merely a part of the embodiments of the present disclosure, rather than all the embodiments. Based on the embodiments in the present disclosure, all other embodiments obtained by a person of ordinary skill in the art without involving any inventive effort shall fall within the scope of the present disclosure.

Referring to FIGS. 1 to 5, a first implementation of the present disclosure provides a magnetic sensing device having a relative motion relationship with an object (not shown) in a direction of movement X, the object having a magnetic field to be measured thereon, the magnetic sensing device configured to sense a distance or a speed or an angle of movement and a direction of movement of the relative motion. The magnetic sensing device includes the following.

A substrate 100 having a supporting surface 101, the supporting surface being parallel to the direction of movement X, on which a first sensing area 201, a third sensing area 203, and a second sensing area 202 are consecutively arranged along the direction of movement X, the first sensing area 201, the second sensing area 202, and the third sensing area 203 having a first midline 211, a second midline 212, and a third midline 213, respectively, in the direction of movement, the first midline 211, the second midline 212, and the third midline 213 passing through midpoints of projection lengths of the first sensing area 201, the second sensing area 202, and the third sensing area 203 in the direction of movement X, respectively, and being perpendicular to the direction of movement X, the first midline 211 and the second midline 212 being symmetrical with respect to the third midline 213.

The first sensing area 201 and the second sensing area 202 are jointly configured to output a first output signal V1. The third sensing area 203 is configured to output a second output signal V2. A phase difference of the first output signal V1 and the second output signal V2 is 90 degrees, and the first output signal V1 and the second output signal V2 are jointly configured to determine the distance or the speed or the angle of movement and the direction of movement of the relative motion.

In this case, the magnetic sensing device has a relative motion relationship with the object in the direction of movement X. It can be that the magnetic sensing device is stationary and the object is moving; it can also be that the magnetic sensing device is moving and the object is stationary. In either case, it is acceptable. The relative motion may be movement along a straight line, either unidirectional movement or bi-directional reciprocating movement, so that the magnetic sensing device described in the present disclosure is used to sense a distance or a speed or a direction of movement of the relative motion. The relative motion may also be a rotational motion, either unidirectional movement or bi-directional reciprocating movement, so that the magnetic sensing device described in the present disclosure is used to sense an angle or the speed (angular speed) and a direction of movement of the relative motion. The object has a magnetic field to be measured thereon. For example, a magnetic encoder is mounted on the object, and the magnetic sensing device is capable of sensing the magnetic field of the magnetic encoder so as to determine the distance or speed or angle of movement and the direction of movement of the relative motion.

The substrate 100 may be a silicon substrate, and may also include associated circuits (such as the first operational amplifier A1 and the second operational amplifier A2 described hereinafter) that the magnetic sensing device is required to cooperate with to implement a more complete function of the magnetic sensing device. Of course, it may also be a substrate that provides only mechanical support, and the associated circuits that the magnetic sensing device is required to cooperate with are provided at other positions. Generally, the substrate 100 is in the form of a flat plate, and the supporting surface 101 thereon is in the form of a plane. If the relative motion is movement along a straight line, the direction of movement X is a straight line. Accordingly, the supporting surface 101 of the substrate 100 is kept parallel to the direction of movement X. If the relative motion is rotational movement, the direction of movement X is a curve. Because the magnetic sensing device is very small in volume with respect to the object, it can be considered that the supporting surface 101 of the substrate 100, which is in fact a plane, is parallel to the direction of movement X, which is in fact a curve. Of course, it is also possible for the substrate 100 to have a curved shape and for the supporting surface 101 thereon to have a curved surface.

Referring to FIG. 1, in a first embodiment, each of the first sensing area 201, the second sensing area 202, and the third sensing area 203 is regularly shaped and configured on the supporting surface 101. The first midline 211, the second midline 212, and the third midline 213 are central axes of the first sensing area 201, the second sensing area 202, and the third sensing area 203, respectively. The first sensing area 201, the second sensing area 202, and the third sensing area 203 are symmetrical with respect to the first midline 211, the second midline 212, and the third midline 213, respectively.

In the first embodiment shown in FIG. 1, each of the first sensing area 201, the second sensing area 202, and the third sensing area 203 is rectangular in shape, with the narrow sides being parallel to the direction of movement X, and the long sides being perpendicular to the direction of movement X, that is, being parallel to the longitudinal axis direction Y in the figure. Thus, the first midline 211, the second midline 212, and the third midline 213 are the central axes of the first sensing area 201, the second sensing area 202, and the third sensing area 203, respectively, perpendicular to the of the narrow sides. Accordingly, the first sensing area 201, the second sensing area 202, and the third sensing area 203 are symmetrical with respect to the first midline 211, the second midline 212, and the third midline 213, respectively. At this time, the first midline 211 and the second midline 212 are symmetrical with respect to the third midline 213, which can significantly reduce the difficulty from the perspective of design and manufacturing. Of course, the first sensing area 201, the second sensing area 202, and the third sensing area 203 may be square or other regular shapes or even irregular shapes, and may be arranged regularly or irregularly (i.e., arbitrarily), provided that the following conditions are satisfied: the first sensing area 201, the second sensing area 202, and the third sensing area 203 have a first midline 211, a second midline 212, and a third midline 213 in the direction of movement X, respectively, and the first midline 211, the second midline 212, and the third midline 213 pass through midpoints of the projection lengths of the first sensing area 201, the second sensing area 202, and the third sensing area 203 in the direction of movement X, respectively, and are perpendicular to the direction of movement X, and the first midline 211 and the second midline 212 are symmetrical with respect to the third midline 213. For ease of understanding and simplification of the description, both the following and the accompanying drawings are shown in regular shapes and in regular arrangements, and it will be readily understood by those skilled in the art that, when configured in irregular shapes or irregular arrangements as desired, adaptive adjustments may be made to the teachings of the foregoing disclosure, and are intended to be included within the scope of the present disclosure.

Referring to FIG. 1, in the first embodiment, each of the first sensing area 201 and the second sensing area 202 includes a first sensing cell R11 or R21. Each of the first sensing cells R11 and R21 has a midline in the direction of movement X. The midline of the first sensing cell R11 of the first sensing area 201 coincides with the first midline 211 of the first sensing area 201. The midline of the first sensing cell R21 of the second sensing area 202 coincides with the second midline 212 of the second sensing area 202. The two first sensing cells 111, R21 produce changes with equal numerical values and same directions for a same magnetic field to be measured. The two first sensing cells R11, R21 are connected in series into a half-bridge structure to form a first sensor. A connection point between the two first sensing cells R11, R21 outputs a first sensing signal S1 for generating a first output signal V1 Here, the two first sensing cells R11 and R21 produce changes with equal numerical values and same directions for a same magnetic field to be measured. Taking the first embodiment shown in FIG. 1 as an example where the first sensing cells R11 and R21 are anisotropic magnetoresistive cells, when the two first sensing cells RH and R21 are under a same magnetic field to be measured the resistances of both anisotropic magnetoresistive cells become larger or smaller than under a zero magnetic field (this can be referred to as having the same characteristics). Thus, the phase of the first sensing signal S1 is substantially a difference between a phase of a sensing signal of the first sensing cell R11 of the first sensing area 201 when sensing a same magnetic field to be measured and a phase of a sensing signal of the first sensing cell R21 of the second sensing area 202 when sensing the same magnetic field to be measured.

Referring to FIG. 1, in the first embodiment, the third sensing area 203 includes a first sensing cell R31+ and a second sensing cell R31–. The first sensing cell R31+ and the second sensing cell R31– each have a midline in the direction of movement and both the midlines coincide with a third midline 213 of the third sensing area 203. The first sensing cell R31+ and the second sensing cell R31– produce changes with equal numerical values and opposite directions for a same magnetic field to be measured. The first sensing cell R31+ and the second sensing cell R31– are connected in series into a half-bridge structure to form a third sensor. A connection point between the first sensing cell R31+ and the second sensing cell R31– outputs a third sensing signal S3 which is configured to generate the second output signal V2. First, it should be noted that both of the first sensing cell R31+ and the second sensing cell R31– in this paragraph belong to the third sensing area 203, and do not relate to the first sensing area 201 or the second sensing area 202. Here, the first sensing cell R31+ and the second sensing cell R31– produce changes with equal numerical values and opposite directions for a same magnetic field to be measured. Taking the first embodiment shown in FIG. 1 as an example where the first sensing cell R31+ and the second sensing cell R31– are anisotropic magnetoresistive cells, when the first sensing cell R31+ is under a magnetic field to be measured the resistance of the anisotropic magnetoresistive cell becomes larger than under a zero magnetic field, and when the second sensing cell R31– is under the same magnetic field to be measured the resistance of the anisotropic magnetoresistive cell becomes smaller than under the zero magnetic field; or when the first sensing cell R31+ is under a magnetic field to be measured the resistance of the anisotropic magnetoresistive cell becomes smaller than under the zero magnetic field, and when the second sensing cell R31– is under the same magnetic field to be measured the resistance of the anisotropic magnetoresistive cell becomes larger than under a zero magnetic field. That is, the characteristics of the first sensing cell R31+ and the second sensing cell R31– are opposite (where the signs + and – are used to indicate being opposite). Because the first midline 211 of the first sensing area 201 and the second midline 212 of the second sensing area 202 are symmetrical with respect to the third midline 213 of the third sensing area 203, a phase difference between the first sensing signal S1 jointly generated by the first sensing area 201 and the second sensing area 202 and the third sensing signal S3 generated by the third sensing area 203 is 90 degrees. Subject to subsequent calculation, the first sensing signal S1 and the third sensing signal S3 are jointly configured to determine the distance or the speed or the angle of movement and the direction of movement of the relative motion, and an accurate result can be acquired regardless of under a tow-intensity magnetic field to be measured or a high-intensity magnetic field to be measured.

Referring to FIG. 1, in the first embodiment, the magnetic sensing device further includes a first operational amplifier A1 and a second operational amplifier A2. The first sensing area 201 and the second sensing area 202 are connected to the first operational amplifier A1, which outputs the first output signal V1. The third sensing area 203 is connected to the second operational amplifier A2, which outputs the second output signal V2. Because the first sensing area 201 and the second sensing area 202 jointly generate one signal, i.e., the first sensing signal S1, and the third sensing area 203 generates one signal, i.e., the third sensing signal S3, the first operational amplifier A1 and the second operational amplifier A2 can output the first output signal V1 and the second output signal V2, respectively, only by performing amplification calculation. Moreover, in the first embodiment shown in FIG. 1, taking each sensing cell being an anisotropic magnetoresistive cell as an example, the first sensing cell R11 of the first sensing area 201 and the first sensing cell R21 of the second sensing area 202 have the same shape and size, produce changes with equal numerical values and same directions for a same magnetic field to be measured, the calculation of the first operational amplifier A1 does not take into account the size ratio relationship between the first sensing cell R11 of the first sensing area 201 and the first sensing cell R21 of the second sensing area 202. If the first sensing cell R11 of the first sensing area 201 is different from the first sensing cell R21 of the second sensing area 202 in shape or size, the calculation of the first operational amplifier A1 takes into account the size ratio relationship between the two first sensing cells R11, R21, and the calculation is thus more complicated. Similarly, the first sensing cell R31+ of the third sensing area 203 and the second sensing cell R31− of the third sensing area 203 have the same shape and size, produce changes with equal numerical values and opposite directions for a same magnetic field to be measured, the calculation of the second operational amplifier A2 does not take into account the size ratio relationship between the first sensing cell R31+ of the third sensing area 203 and the second sensing cell R31− of the third sensing area 203. If the first sensing cell R31+ of the third sensing area 203 is different from the second sensing cell R31− of the third sensing area 203 in shape or size, the calculation of the second operational amplifier A2 takes into account the size ratio relationship between the first sensing cell R31+ of the third sensing area 203 and the second sensing cell R31− of the third sensing area 203, and the calculation is thus more complicated. In general, the first sensing cell R11 of the first sensing area 201 and the first sensing cell R21 of the second sensing area 202 produce changes with equal numerical values and same directions for a same magnetic field to be measured, and the first sensing signal S1 has the highest sensibility, thereby facilitating signal acquisition; the first sensing cell R31+ of the third sensing area 203 and the second sensing cell R31− of the third sensing area 203 produce changes with equal numerical values and opposite directions for a same magnetic field to be measured, and the third sensing signal S3 has the highest sensibility, thereby facilitating signal acquisition. Furthermore, each of the sensing cells may have the same shape and size, and the overall structure is relatively simple, which is helpful for design and manufacture. It is also possible, in a particular case, for the need to vary the shape and size of each sensing cell, as long as the corresponding design, manufacture and calculation are adjusted accordingly. The following implementations will be explained in terms of each sensing cell have the same shape and size.

To be more complete, of course, free ends of each sensing cell of each sensing area also need to be connected to a power supply terminal Vdd and a ground terminal Gnd, respectively, so that the magnetic sensing device can be operated. In the subsequent embodiments, details on this are not described. It is possible for the magnetic sensing device of the present implementation to have sensor impedance improved, area reduced, and lower power consumption and lower cost achieved.

Figure 2:
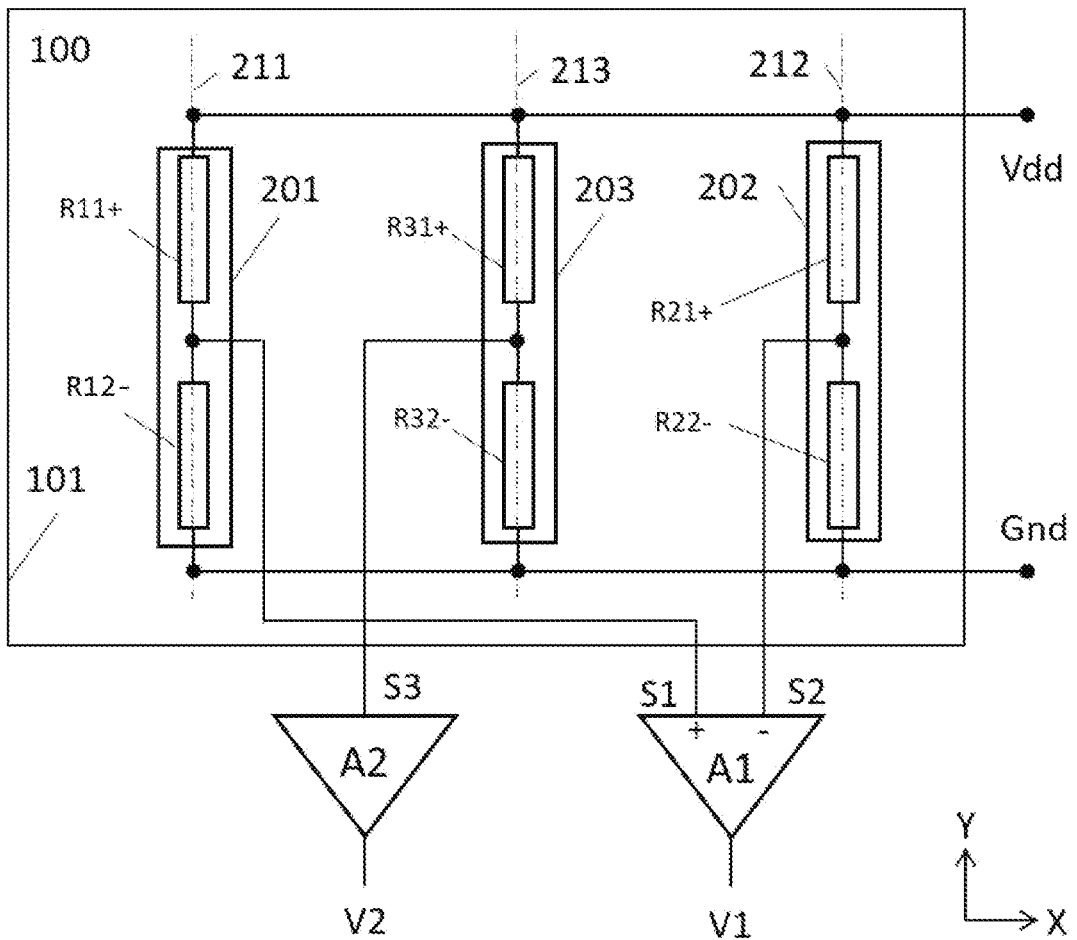
FIG. 2 is a schematic structural diagram of a second embodiment of a magnetic sensing device according to a first implementation of the present disclosure.

Referring to FIG. 2, in the second embodiment, the main differences from the first embodiment shown in FIG. 1 lie in the following. The first sensing area 201 and the second sensing area 202 each include first sensing cells R11+, R21+, and second sensing cells R12−, R22−. Each of the first sensing cells R11+, R21+, and the second sensing cells R12−, R22− has a midline in the direction of movement X. The midline of the first sensing cell R11+ of the first sensing area 201 coincides with the midline of the second sensing cell R12− of the first sensing area 201 and the first midline 211 of the first sensing area 201. The midline of the first sensing cell R21+ of the second sensing area 202 coincides with the midline of the second sensing cell R22− of the second sensing area 202 and the second midline 212 of the second sensing area 202. The two first sensing cells R11+, R21+ produce changes with equal numerical values and same directions for a same magnetic field to be measured, and the changes have equal numerical values and opposite directions with the changes produced by the two second sensing cells R12−, R22− for the same magnetic field to be measured. (The two second sensing cells R12−, R22− produce changes with equal numerical values and same directions for the same magnetic field to be measured. The changes produced by the two first sensing cells R11+, R21+ have equal numerical values and opposite directions with the changed produced by the two second sensing cells R12−, R22−). The first sensing cell R11+ and the second sensing cell R12− of the first sensing area 201 are connected in series into a half-bridge structure to form a first sensor. A connection point between the first sensing cell R11+ and the second sensing cell R12− of the first sensing area 201 outputs a first sensing signal S1. The first sensing cell R21+ and the second sensing cell R22− of the second sensing area 202 are connected in series into a half-bridge structure to form a second sensor. A connection point between the first sensing cell R21+ and the second sensing cell R22− of the second sensing area 202 outputs a second sensing signal S2. The first sensing signal S1 and the second sensing signal S2 are configured to generate the first output signal V1. In the present implementation, the first sensing area 201 generates the first sensing signal S1, and the second sensing area 202 generates the second sensing signal S2. Accordingly, the first operational amplifier A1 performs addition or subtraction calculation while performing amplification calculation. In the second implementation shown in FIG. 2, the two first sensing cells R11+, R21+ produce changes with equal numerical values and same directions for a same magnetic field to be measured, and the changes have equal numerical values and opposite directions with the changes produced by the two second sensing cells R12−, R22− for the same magnetic field to be measured. (The two second sensing cells R12−, R22− produce changes with equal numerical values and same directions for the same magnetic field to be measured. The changes produced by the two first sensing cells R11+, R21+ have equal numerical values and opposite directions with the changed produced by the two second sensing cells R12−, R22−). Moreover, the two first sensing cells R11+, R21+ are symmetrical with respect to the third midline 213, and the two second sensing cells R12−, R22− are symmetrical with respect to the third midline 213. The first operational amplifier A1 performs subtraction calculation while performing amplification calculation. If the position of the first sensing cell R11+ and the position of the second sensing cell R12− of the first sensing area 201 are interchanged, or the position of the first sensing cell R21+ and the position of the second sensing cell R22− of the second sensing area 202 are interchanged, the first operational amplifier A1 performs addition calculation while performing amplification calculation. Moreover, as described above, if the sensing cells are different in shape and size, the calculation of the first operational amplifier A1 also takes into account the size ratio relationship between the sensing cells. Those skilled in the art, in light of the teachings of the present disclosure, can think of how to make adaptations. The second embodiment shown in FIG. 2 acquires the first output signal V1 more stably and accurately than the first embodiment shown in FIG. 1.

Figure 3:
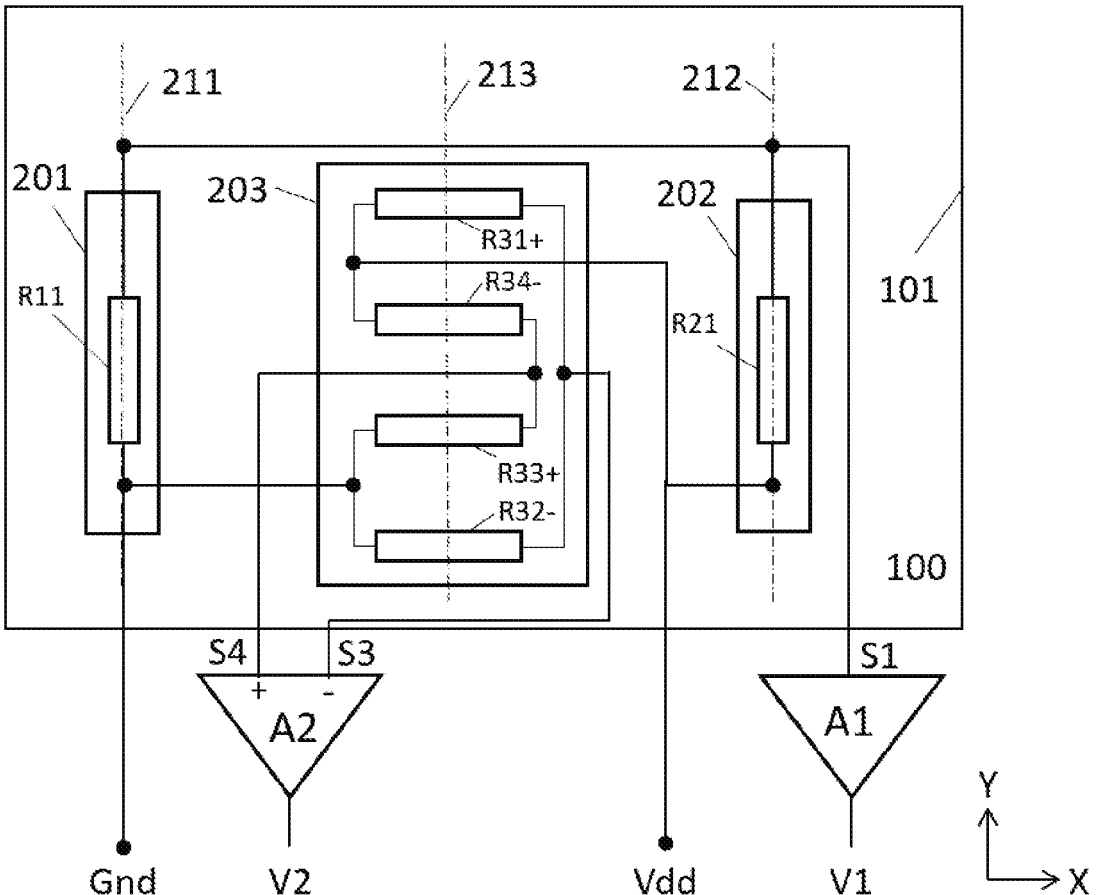
FIG. 3 is a schematic structural diagram of a third embodiment of a magnetic sensing device according to a first implementation of the present disclosure.

Referring to FIG. 3, in the third embodiment, the main differences from the first embodiment shown in FIG. 1 lie in the following. The third sensing area 203 includes a first sensing cell R31+, a second sensing cell R32−, a third sensing cell R33+, and a fourth sensing cell R31−. The first sensing cell R31+, the second sensing cell R32−, the third sensing cell R33+, and the fourth sensing cell R34− each have a midline in the direction of movement X and the midlines all coincide with the third midline 213 of the third sensing area 203. The first sensing cell R31+ and the third sensing cell R33+ produce changes with equal numerical values and same directions for a same magnetic field to be measured, and the changes have equal numerical values and opposite directions with the changes produced by the second sensing cell R32– and the fourth sensing cell R34– for the same magnetic field to be measured. (The second sensing cell R32– and the fourth sensing cell R34– produce changes with equal numerical values and same directions for the same magnetic field to be measured. The changes produced by the first sensing cell R31+ and the third sensing cell R33+ have equal numerical values and opposite directions with the changed produced by the second sensing cell R32– and the fourth sensing cell R34–). The first sensing cell R31+ and the second sensing cell R32– are connected in series into a half-bridge structure, and a connection point between the first sensing cell R31+ and the second sensing cell R32– outputs a third sensing signal S3. The third sensing cell R33+ and the fourth sensing cell R34– are connected in series into a half-bridge structure, and a connection point between the third sensing cell R33+ and the fourth sensing cell R34– outputs a fourth sensing signal S4. The two half-bridge structures are connected into a full-bridge structure to form a third sensor. The third sensing signal S3 and the fourth sensing signal S4 are configured to generate the second output signal V2. The first sensing cell R31+, the second sensing cell R32–, the third sensing cell R33+, and the fourth sensing cell R34– are randomly arranged on the third midline 213. Optionally, the first sensing cell R31+, the fourth sensing cell R34–, the third sensing cell R33+, and the second sensing cell R32– are sequentially and consecutively arranged on the third midline 213. Accordingly, the second operational amplifier A2 performs addition calculation while performing amplification calculation. In the present implementation, the third sensing area 203 adopts four sensing cells, and the acquisition of the second output signal V2 is more stable and accurate. Moreover, the arrangement of the four sensing cells on the third midline 213 may be arbitrarily arranged. But, the more evenly arranged the better, because in this way, differences in the distribution of the measured magnetic field on the third midline 213 can be sensed more evenly. In the third embodiment shown in FIG. 3, the shapes and sizes of the four sensing cells are the same. Moreover, the first sensing cell R31+, the fourth sensing cell R34–, the third sensing cell R33+, and the second sensing cell R32– are sequentially and consecutively arranged on the third midline 213, so that the first sensing cell R31+, the fourth sensing cell R34–, the third sensing cell R33+, and the second sensing cell R32– are most evenly distributed, the magnetic field to be measured is sensed most evenly. Moreover, the first sensing cell R31+, the fourth sensing cell R34–, the third sensing cell R33+, and the second sensing cell R32– may be led out through a metal wiring layer, and the structure is also very simple. Of course, it is to be noted that, as described above, if the four sensing cells are different in shape and size, the calculation of the second operational amplifier A2 also takes into account the size ratio relationship between the sensing cells.

Figure 4:
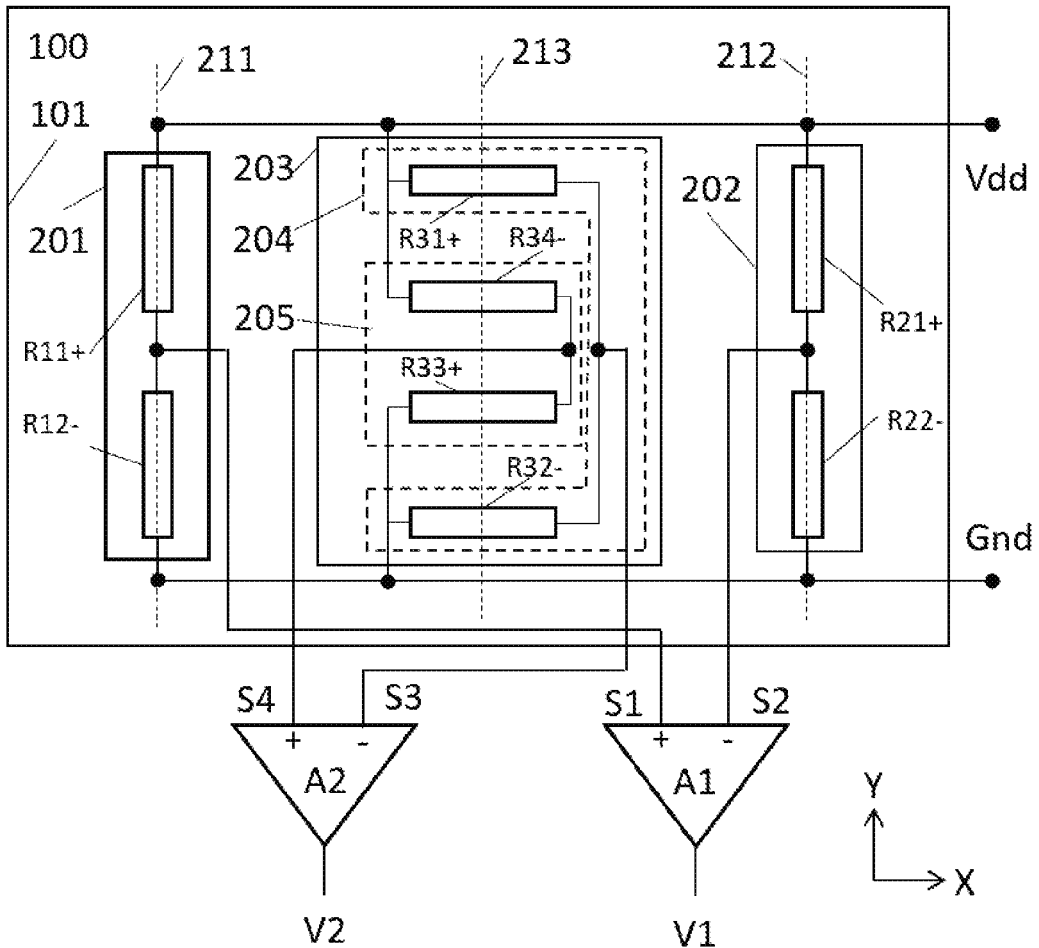
FIG. 4 is a schematic structural diagram of a fourth embodiment of a magnetic sensing device according to a first implementation of the present disclosure.

Referring to FIG. 4, in the fourth embodiment, the main differences from the third embodiment shown in FIG. 3 lie in the following. The first sensing area 201 and the second sensing area 202 also adopt the structures of the first sensing area 201 and the second sensing area 202 in the second embodiment shown in FIG. 2. In the first sensing area 201, a half-bridge structure forms a first sensor for generating a first sensing signal S1 having a first phase. In the second sensing area 202, a half-bridge structure forms a second sensor generating a second sensing signal S2 having a second phase. In the third sensing area 203, a full-bridge structure forms a third sensor. The third sensor of this full-bridge structure may also be considered to be sensors of two half-bridge structures, such as named as a fourth sensor 204 and a fifth sensor 205, respectively. As such, the four sensors are of half-bridge structure and maintain a certain symmetrical relationship with each other. To understand from the simple example of all sensing cells in the fourth embodiment shown in NG. 4 being of the same shape and size and placed regularly in a regular shape, the fourth sensor 204 and fifth sensor 205 are actually located at a central axis (the third midline 213) between the first sensor and the second sensor, and are symmetrical with respect to the central axis (the third midline 213). Therefore, the fourth sensor 204 generates a third sensing signal S3 having a third phase that is at the midpoint of the first phase and the second phase. The fifth sensor 205 generates a fourth sensing signal S4 having a fourth phase that is inverted from the third phase. By performing calculation processing on the first sensing signal S1 output by the first sensor, the second sensing signal S2 output by the second sensor, the third sensing signal S3 output by the fourth sensor 204, and the fourth sensing signal S4 output by the fifth sensor 205, respectively, the acquired first output signal V1 and second output signal V2 have a phase difference of 90 degrees, which makes it possible to output a correct result in both a low-intensity measured magnetic field and a high-intensity measured magnetic field.

Figure 6:
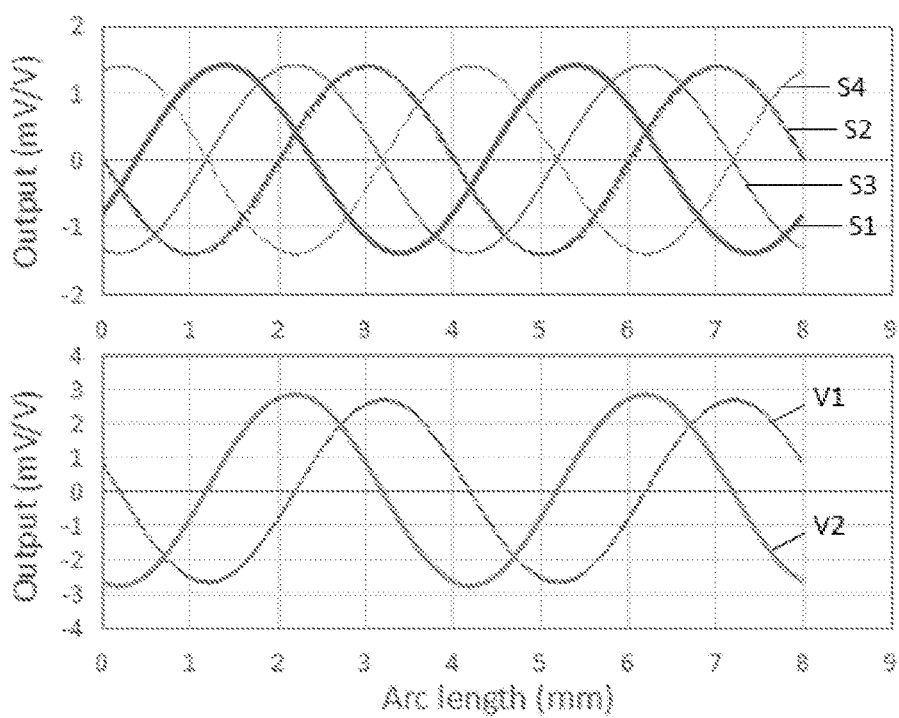
FIG. 6 is a waveform diagram of each signal of the magnetic sensing device shown in FIG. 4 under the magnetic bias field of 100G and the magnetic field to be measured of 10G.

Referring to FIG. 6, there is shown a schematic diagram of waveforms of the signals of the magnetic sensing device of the fourth embodiment shown in FIG. 4 when the magnetic bias field is of 100G and the magnetic field to be measured is of 10G. In the upper figure, the four lines are the waveforms of the first sensing signal S1, the second sensing signal S2, the third sensing signal S3, and the fourth sensing signal S4, respectively. When the magnetic field to be measured changes with +/–10G, outputs of the four sensors all fall in a linear region so that the first sensing signal S1, the second sensing signal S2, the third sensing signal S3, and the fourth sensing signal S4 all present a sine waveform, where the phase of the third sensing signal S3 is opposite to that of the fourth sensing signal S4 and is located at the midpoint of the phases of the first sensing signal S1 and the second sensing signal S2. The two lines in the lower figure are the waveforms of the first output signal V1 and the second output signal V2, respectively, both of which exhibit a sine-wave waveform and are characterized by a phase difference of 90 degrees. By calculating the number of times the second output signal V2 passes through the zero point, a distance or speed or angle of movement of the relative motion can be acquired, whereas direction information of movement of the relative motion is determined by the direction of the second output signal V2 passing through the zero point, in conjunction with the positive or negative state of the first output signal V1. For example, if the second output signal V2 passes through the zero point from positive to negative, and the first output signal V1 is a positive value, then it represents a direction of movement of the relative motion is a certain direction; if the second output signal V2 passes through the zero point from positive to negative, and the first output signal V1 is a negative value, then it represents the direction of movement of the relative motion is an opposite of the certain direction (note that only one case is shown in FIG. 6). In other words, whether the first output signal V1 is in a positive or negative stage, the second output signal V2 shall pass through a zero point once and only once (from positive to negative or from negative to positive).

Figure 7:
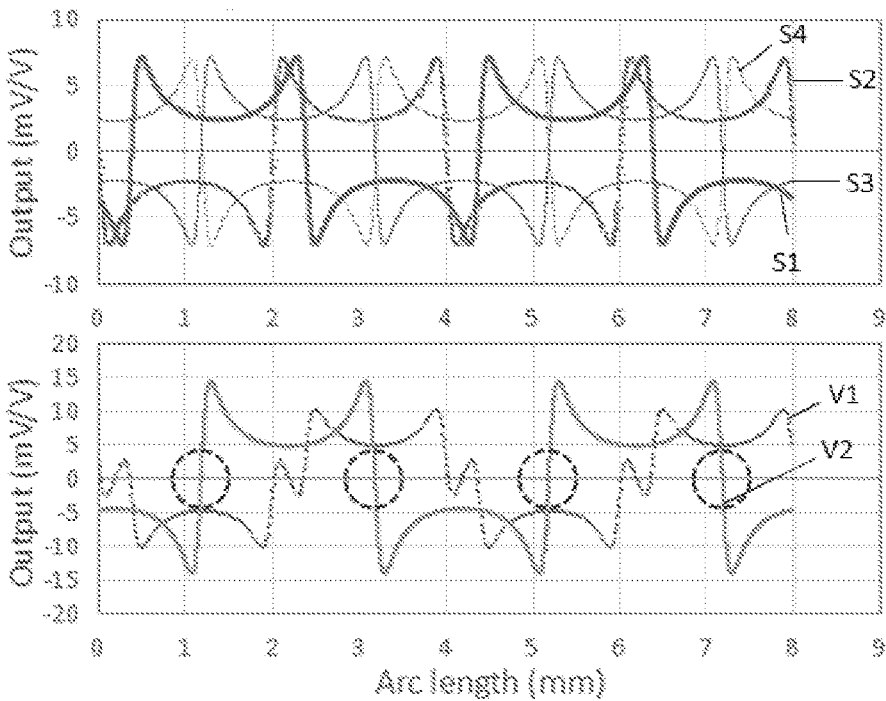
FIG. 7 is a waveform diagram of each signal of the magnetic sensing device shown in FIG. 4 under the magnetic bias field of 100G and the magnetic field to be measured of 600G.

Referring to FIG. 7, there is shown a schematic diagram of waveforms of the signals of the magnetic sensing device of the fourth embodiment shown in FIG. 4 when the magnetic bias field is of 100G and the magnetic field to be measured is of 600G. In the upper figure, the four lines are the waveforms of the first sensing signal S1, the second sensing signal S2, the third sensing signal S3, and the fourth sensing signal S4, respectively. When the magnetic field to be measured changes within +/−600G, the output characteristic of the sensor is reciprocated between the linear increasing area and decreasing area, thereby forming a special waveform. The two lines in the lower figure are the waveforms of the first output signal V1 and the second output signal V2, respectively, from which it can be clearly seen that the second output signal V2 passes through the zeros only once, whether the first output signal V1 is in a positive or negative stage.

Figure 8:
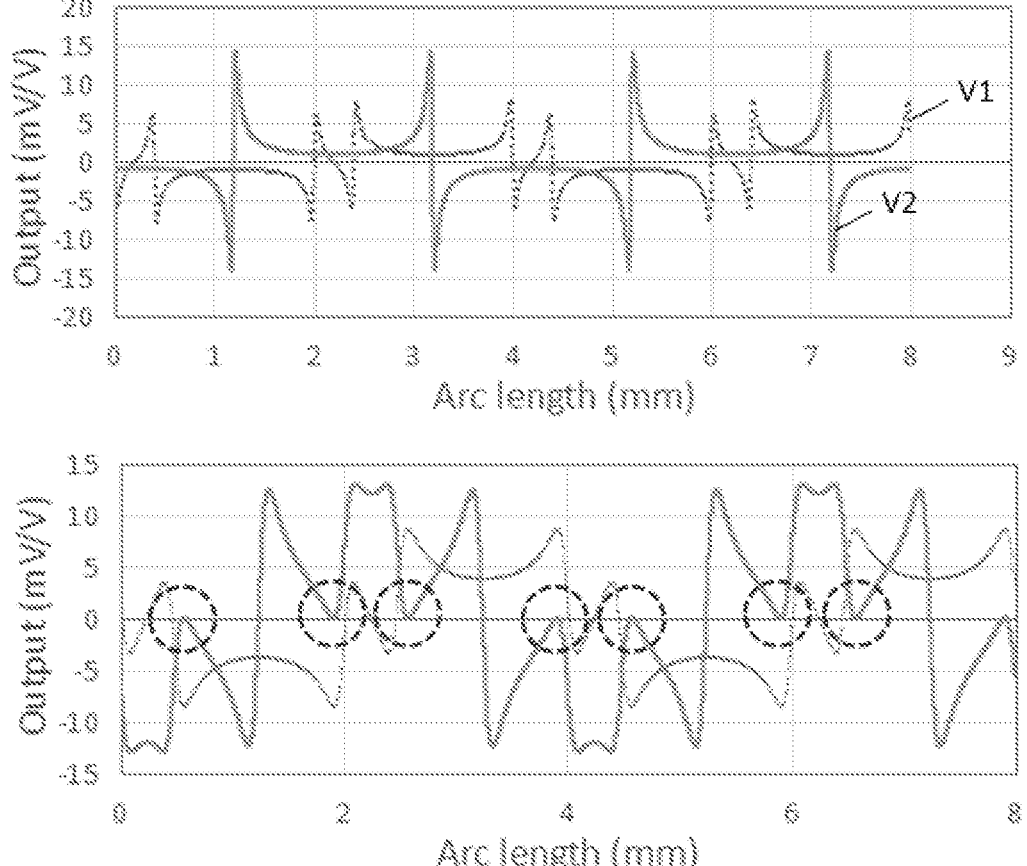
FIG. 8 is a waveform diagram of each signal of the magnetic sensing device shown in FIG. 4 and the conventional magnetic sensing device under the magnetic bias field of 100G and the magnetic field to be measured of 3000G.

Referring to FIG. 8, there is shown a schematic diagram of waveforms of the signals of the magnetic sensing device of the fourth embodiment shown in FIG. 4 and the conventional magnetic sensing device when the magnetic bias field is of 100G and the magnetic field to be measured is of 3000G. The two lines in the upper figure are the waveforms of the first output signal V1 and the second output signal V2 of the magnetic sensing device described in the present disclosure, respectively. It can be clearly seen that the second output signal V2 passes through a zero point only once whether the first output signal V1 is at a positive value or a negative value stage. The two lines in the lower figure are waveforms of the first output signal and the second output signal of the conventional magnetic sensing device, respectively. It can be clearly seen that the second output signal is seriously distorted, and the second output signal passes through the zero point for a plurality of times whether the first output signal is in a positive or negative stage, which affects the accuracy of the sensing result. The distortion of the second output signal V2 described in the present disclosure is improved very well, so that the sensing result (the distance or the speed or the angle of movement of the relative motion) is accurate.

Figure 5:
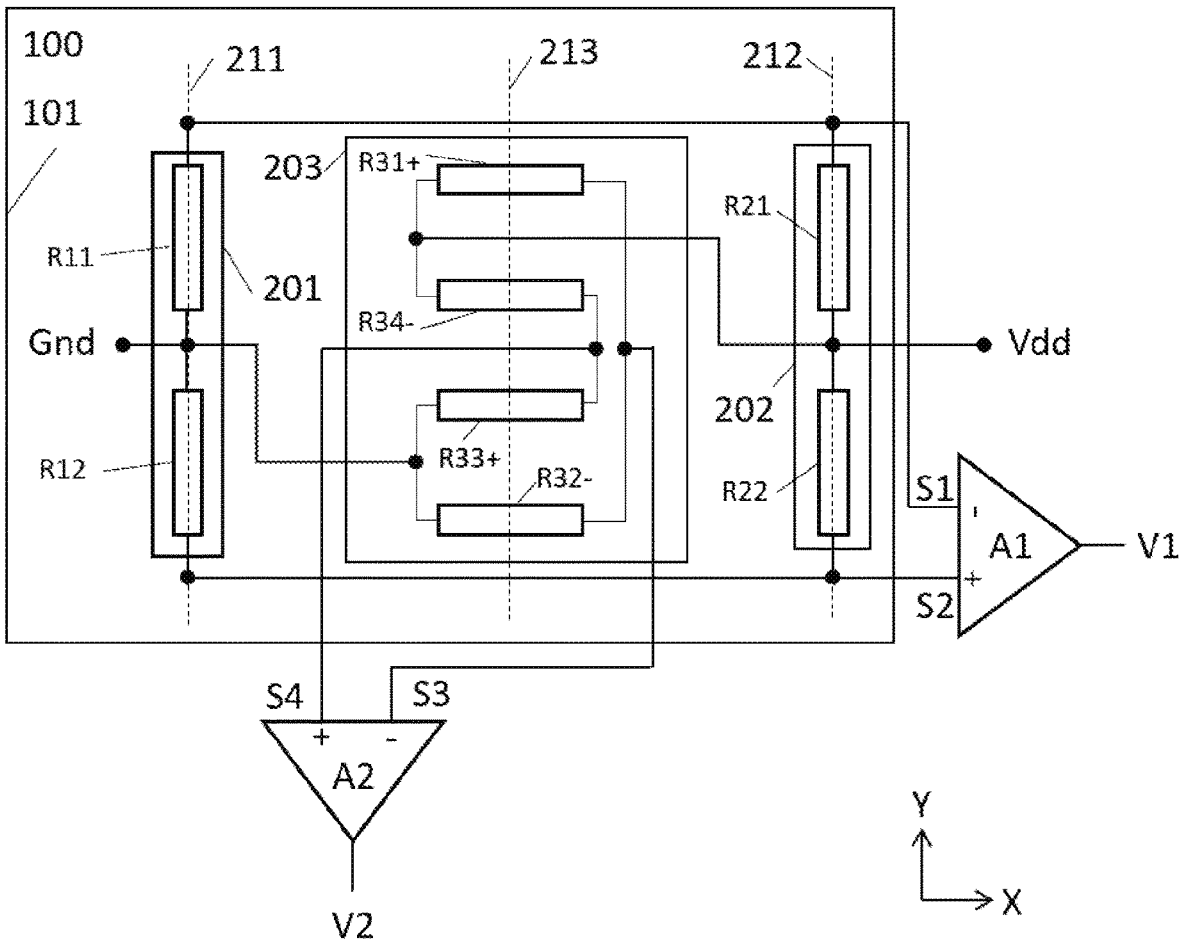
FIG. 5 is a schematic structural diagram of a fifth embodiment of a magnetic sensing device according to a first implementation of the present disclosure.

Referring to FIG. 5, in a fifth embodiment, the main differences from the fourth embodiment shown in FIG. 4 lie in the following. The first sensing area 201 and the second sensing area 202 each include first sensing cells R11, R21, and second sensing cells R12, R22. Each of the first sensing cats R11, R21, and the second sensing cells R12, R22 has a midline in the direction of movement X. The midline of the first sensing cell R11 of the first sensing area 201 coincides with the midline of the second sensing cell R12 of the first sensing area 201 and the first midline 211 of the first sensing area 201. The midline of the first sensing cell R21 of the second sensing area 202 coincides with the midline of the second sensing cell R22 of the second sensing area 202 and the second midline 212 of the second sensing area 202. The two first sensing cells R11, R21 produce changes with equal numerical values and same directions for a same magnetic field to be measured, and the changes have equal numerical values and same or opposite directions with the changes produced by the two second sensing cells R12, R22 for the same magnetic field to be measured. (The two second sensing cells R12, R22 produce changes with equal numerical values and same directions for the same magnetic field to be measured. The changes produced by the two first sensing cells R11, R21 have equal numerical values and same or opposite directions with the changed produced by the two second sensing cells R12, R22). The first sensing cell R11 of the first sensing area 201 and the first sensing cell R21 of the second sensing area 202 are connected in series into a half-bridge structure to form a first sensor. A connection point between the first sensing cell R11 of the first sensing area 201 and the first sensing cell R21 of the second sensing area 202 outputs a first sensing signal S1. The second sensing cell R12 of the first sensing area 201 and the second sensing cell R22 of the second sensing area 202 are connected in series into a half-bridge structure to form a second sensor. A connection point between the second sensing cell R12 of the first sensing area 201 and the second sensing cell R22 of the second sensing area 202 outputs a second sensing signal S2. The first sensing signal S1 and the second sensing signal S2 are configured to generate the first output signal V1. That is, a portion of the sensing cells of the first sensing area 201 and a portion of the sensing cells of the second sensing area 202 jointly form a first sensor, for generating a first sensing signal S1; the other portion of the sensing cells of the first sensing area 201 and the other portion of the sensing cells of the second sensing area 202 jointly form a second sensor, for generating a second sensing signal S2. The distortion of the first output signal V1 calculated by the first sensing signal S1 and the second sensing signal S2 under high intensity magnetic field can also be improved, thereby avoiding errors in the sensing results of a direction of movement of the relative motion and further ensuring the accuracy of the sensing results. It is only necessary that the portions of the sensing cells of the first sensing area 201 and the second sensing area 202 forming the first sensor produce changes with equal numerical values and same directions for a same magnetic field to be measured, and that the other portions of the sensing cells of the first sensing area 201 and the second sensing area 202 forming the second sensor produce changes with equal numerical values and same directions for the same magnetic field to be measured. As for the portions of the sensing cells of the first sensing area 201 and the second sensing area 202 forming the first sensor and the other portions of the sensing cells of the first sensing area 201 and the second sensing area 202 forming the second sensor, it is acceptable for them to produce changes with equal numerical values and same or opposite directions for a same magnetic field to be measured.

In general, the first sensing area 201, the second sensing area 202, and/or the third sensing area 203 may each include a plurality of sensing cells. For example, the first sensing area 201 and the second sensing area 202 include a plurality of sensing cells, each of the sensing cells having a midline in the direction of movement. X, the midlines of the sensing cells of the first sensing area 201 coinciding with the first midline 211 of the first sensing area 201, and each of the sensing cells being consecutively arranged on the first midline 211; the midlines of the sensing cells of the second sensing area 202 coinciding with the second midline 212 of the second sensing area 202, and each of the sensing cells being consecutively arranged on the second midline 212. Each of the sensing cells of the first sensing area 201 and the second sensing area 202 may be connected in series, may be connected in parallel, or may be connected in both series and parallel, provided that all the sensing cells are finally connected into a half-bridge structure or a full-bridge structure, and then the first output signal V1 is generated. Optionally, portions of the sensing cells of the first sensing area 201 and the second sensing area 202 produce changes with equal numerical values and same directions for a same magnetic field to be measured, which changes have equal numerical values and opposite directions with the changes produced by the other portions of the sensing cells of the first sensing area 201 and the second sensing area 202 for the same magnetic field to be measured, and the sensing cells of the two portions are alternate and arranged on the first midline 211 and the second midline 212 one-by-one and spaced from each other. That is, the distribution of the two kinds of sensing cells of opposite characteristics on the first midline 211 and the second midline 212 is one-by-one and spaced from each other, so that the magnetic field to be measured can be sensed more evenly. Of course, if the characteristics of the sensing cells are the same, they may be arranged one-by-one sequentially. For another example, the third sensing area 203 includes a plurality of sensing cells, each of the sensing cells having a midline in the direction of movement X, and each of the sensing cells of the third sensing area 203 may be connected in series, may be connected in parallel, or may be connected in both series and parallel, provided that all the sensing cells are finally connected into a half-bridge structure or a full-bridge structure, and then the second output signal V2 is generated. Of course, a portion of the sensing cells of the third sensing area 203 and the other portion of the sensing cells of the third sensing area 203 produce changes with equal numerical values and opposite directions for a same magnetic field to be measured, and the sensing cells of the two portions may be arranged arbitrarily on the third midline 213, or may be arranged sequentially. In short, the more evenly arranged the better. For example, the best effect is achieved by having them arranged alternately and one-by-one and spaced from each other. However, it should be noted that the greater the number of sensing cells, the greater in terms of the number of metal wiring layers required to connect therebetween, the difficulty in designing and manufacturing, and the higher the material cost and the process cost. In general, according to the teachings of the entire technical contents of the present disclosure, the sensing cells of each sensing area are made to have the same, consistent, corresponding, and symmetrical structure with respect to each other, so that the overall effect is better.

Finally, it should be noted that in the above embodiments, the first sensing area 201, the second sensing area 202, and the third sensing area 203 are all described exemplarily as being formed by anisotropic magnetoresistive cells. In fact, the first sensing area 201, the second sensing area 202, and the third sensing area 203 may be formed by giant magnetoresistive tunneling magnetoresistive cells, or Hall sensing cells, Adaptations or substitutions readily conceivable by those skilled in the art in light of the teachings of the present disclosure shall be included in the protection scope of the present disclosure.

A second implementation of the present disclosure provides a magnetic sensing method for determining a distance or a speed or an angle of movement and a direction of movement of a relative motion between a magnetic sensing device and an object, the magnetic sensing device and the object having a relative motion relationship along a direction of movement X, the object having a magnetic field to be measured thereon, the magnetic sensing device employing the magnetic sensing device as described above. The magnetic sensing method includes the following.

Acquiring a first output signal V1 jointly by the first sensing area 201 and the second sensing area 202, acquiring a second output signal V2 by the third sensing area 203, wherein a phase difference between the first output signal V1 and the second output signal V2 is 90 degrees, and determining the distance or the speed or the angle of movement and the direction of movement of the relative motion according to the first output signal V1 and the second output signal V2.

According to the magnetic sensing device and the magnetic sensing method of the present disclosure, a first sensing area, a third sensing area, and a second sensing area are consecutively arranged on a supporting surface of a substrate in a direction of movement. The first sensing area, the second sensing area, and the third sensing area have respectively a first midline, a second midline, and a third midline in the direction of movement. The first midline, the second midline, and the third midline pass through midpoints of projection lengths of the first sensing area, the second sensing area, and the third sensing area in the direction of movement, respectively, and are perpendicular to the direction of movement, and the first midline and the second midline are symmetrical with respect to the third midline. Acquiring a first output signal jointly by the first sensing area and the second sensing area, acquiring a second output signal by the third sensing area, where a phase difference between the first output signal and the second output signal is 90 degrees, and determining the distance or the speed or the angle of movement and the direction of movement of the relative motion according to the first output signal and the second output signal together. An accurate result can be output regardless of under a tow-intensity magnetic field or a high-intensity magnetic field to be measured. That is, the limitation of the measurement range of the conventional magnetic sensing device is overcome, the measurement range is greatly improved to an intensity of 3000G or more, the tolerance degree to the ambient magnetic field or the signal drift is improved, the range for supportable period of the magnetic field signal is also large, significantly improving the support range and flexibility in terms of applications of the device. It also has good sensitivity to signals. The signal output by the sensor is calculated by the operational amplifier to be the type of final output of the device. No subsequent calculation is required, the circuit structure can be simplified, and the device power consumption and cost can be lowered.

It is to be understood that the above description is for purposes of illustration and not for purposes of limitation. Many embodiments and many applications other than those provided will be apparent to those skilled in the art from a reading of the foregoing description. Accordingly, the scope of the present teachings should not be determined with reference to the foregoing description, but should be determined with reference to the preceding claims and the full scope of equivalents to which such claims are entitled. For purposes of comprehensiveness, the disclosures of all articles and references, including patent applications and publications, are hereby incorporated by reference. The omission of any aspect of the subject matter disclosed herein from the preceding claims is not intended to be a disclaimer of such subject matter, nor should it be deemed that the applicant has failed to consider such subject matter to be part of the subject matter of the disclosed disclosure.

What is claimed is:

1. A magnetic sensing device, the magnetic sensing device having a relative motion relationship with an object in a direction of movement, the object having a magnetic field to be measured thereon, the magnetic sensing device configured to sense a distance or a speed or an angle of movement and the direction of movement of the relative motion, the magnetic sensing device comprising:

a substrate having a supporting surface being parallel to the direction of movement on which a first sensing area, a third sensing area, and a second sensing area are consecutively arranged in the direction of movement, the first sensing area, the second sensing area, and the third sensing area respectively provided with a first midline, a second midline, and a third midline in the direction of movement, the first midline, the second midline, and the third midline respectively passing through midpoints of projection lengths of the first sensing area, the second sensing area, and the third sensing area in the direction of movement and being perpendicular to the direction of movement, and the first midline and the second midline being symmetrical with respect to the third midline;

wherein the first sensing area and the second sensing area are jointly configured to output a first output signal, the third sensing area is configured to output a second output signal, and a phase difference between the first output signal and the second output signal is 90 degrees, and the first output signal and the second output signal are jointly configured to determine the distance or the speed or the angle of movement and the direction of movement of the relative motion;

wherein each of the first sensing area and the second sensing area includes a first sensing cell, each of the first sensing cells has a midline in the direction of movement, the midline of the first sensing cell of the first sensing area coincides with the first midline of the first sensing area, and the midline of the first sensing cell of the second sensing area coincides with the second midline of the second sensing area, the two first sensing cells produce changes with equal numerical values and same directions for a same magnetic field to be measured, the two first sensing cells are connected in series into a half-bridge structure to form a first sensor, and a connection point between the two first sensing cells outputs a first sensing signal, the first sensing signal is configured to generate the first output signal.

2. The magnetic sensing device according to claim 1, wherein each of the first sensing area, the second sensing area, and the third sensing area is regularly shaped and configured on the supporting surface, the first midline, the second midline, and the third midline are central axes of the first sensing area, the second sensing area, and the third sensing area, respectively, the first sensing area, and the second sensing area, and the third sensing area are symmetrical with respect to the first midline, the second midline, and the third midline, respectively.

3. The magnetic sensing device according to claim 1, wherein the third sensing area includes a first sensing cell and a second sensing cell, each of the first sensing cell and the second sensing cell is provided with a midline in the direction of movement, which midlines coincide with the third midline of the third sensing area, the first sensing cell and the second sensing cell produce changes with equal numerical values and opposite directions for a same magnetic field to be measured, the first sensing cell and the second sensing cell are connected in series into a half-bridge structure to form a third sensor, a connection point between the first sensing cell and the second sensing cell outputs a third sensing signal, the third sensing signal is configured to generate the second output signal.

4. The magnetic sensing device according to claim 1, wherein each of the first sensing area and the second sensing area includes a first sensing cell and a second sensing cell, each of the first sensing cells and the second sensing cells has a midline in the direction of movement, the midline of the first sensing cell of the first sensing area coincides with the midline of the second sensing cell of the first sensing area and the first midline of the first sensing area, the midline of the first sensing cell of the second sensing area coincides with the midline of the second sensing cell of the second sensing area and the second midline of the second sensing area, the two first sensing cells produce changes with equal numerical values and same directions for a same magnetic field to be measured, and the changes have equal numerical values and opposite directions with the changes produced by the two second sensing cells for the same magnetic field to be measured, the first sensing cell and the second sensing cell of the first sensing area are connected in series into a half-bridge structure to form a first sensor, a connection point between the first sensing cell and the second sensing cell of the first sensing area outputs a first sensing signal, the first sensing cell and the second sensing cell of the second sensing area are connected in series into a half-bridge structure to form a second sensor, a connection point between the first sensing cell and the second sensing cell of the second sensing area outputs a second sensing signal, and the first sensing signal and the second sensing signal are configured to generate the first output signal.

5. The magnetic sensing device according to claim 1, wherein the third sensing area comprises a first sensing cell, a second sensing cell, a third sensing cell, and a fourth sensing cell, each of the first sensing cell, the second sensing cell, the third sensing cell, and the fourth sensing cell has a midline in the direction of movement which midlines coincide with a third midline of the third sensing area, the first sensing cell and the third sensing cell produce changes with equal numerical values and same directions for a same magnetic field to be measured, and the changes have equal numerical values and opposite directions with the changes produced by the second sensing cell and the fourth sensing cell for the same magnetic field to be measured, the first sensing cell and the second sensing cell are connected in series into a half-bridge structure, and a connection point between the first sensing cell and the second sensing cell outputs a third sensing signal, the third sensing cell and the fourth sensing cell are connected in series into a half-bridge structure, and a connection point between the third sensing cell and the fourth sensing cell outputs a fourth sensing signal, the two half-bridge structures are connected into a full-bridge structure to form a third sensor, the third sensing signal and the fourth sensing signal are configured to generate the second output signal, the first sensing cell, the second sensing cell, the third sensing cell, and the fourth sensing cell are randomly arranged on the third midline, optionally, the first sensing cell, the fourth sensing cell, the third sensing cell, and the second sensing cell are sequentially and consecutively arranged on the third midline.

6. The magnetic sensing device according to claim 1, wherein each of the first sensing area and the second sensing area includes a first sensing cell and a second sensing cell, each of the first sensing cell and the second sensing cell has a midline in the direction of movement, the midline of the first sensing cell of the first sensing area coincides with the midline of the second sensing cell of the first sensing area and the first midline of the first sensing area, the midline of the first sensing cell of the second sensing area coincides with the midline of the second sensing cell of the second sensing area and the second midline of the second sensing area, the two first sensing cells produce changes with equal numerical values and same directions for a same magnetic field to be measured, and the changes have equal numerical values and same or opposite directions with the changes produced by the two second sensing cells for the same magnetic field to be measured, the first sensing cell of the first sensing area and the first sensing cell of the second sensing area are connected in series into a half-bridge structure to form a first sensor, a connection point between the first sensing cell of the first sensing area and the first sensing cell of the second sensing area outputs a first sensing signal, the second sensing cell of the first sensing area and the second sensing cell of the second sensing area are connected in series into a half-bridge structure to form a second sensor, a connection point between the second sensing cell of the first sensing area and the second sensing cell of the second sensing area outputs a second sensing signal, the first sensing signal and the second sensing signal are configured to generate the first output signal.

7. The magnetic sensing device according to claim 1, wherein each of the first sensing area, the second sensing area, and/or the third sensing area comprises a plurality of sensing cells, each of the sensing cells has a midline in the direction of movement, the midlines of the sensing cells of the first sensing area coincide with the first midline of the first sensing area, and the sensing cells are consecutively arranged on the first midline, the midlines of the sensing cells of the second sensing area coincide with the second midline of the second sensing area, and the sensing cells are consecutively arranged on the second midline, a portion of the sensing cells of the first sensing area and the second sensing area are connected in series and/or in parallel, and finally all the sensing cells are connected into a half-bridge structure or a full-bridge structure for generating the first output signal, optionally, a portion of the sensing cells of the first sensing area and the second sensing area produce changes with equal numerical values and same directions for a same magnetic field to be measured, and the changes have equal numerical values and opposite directions with the changes produced by another portion of the sensing cells for the same magnetic field to be measured, the two portions of the sensing cells are alternate and arranged on the first midline and the second midline one-by-one and spaced from each other, a portion of the sensing cells of the third sensing area are connected in series and/or in parallel, and finally all sensing cells are connected into a half-bridge structure or a full-bridge structure for generating the second output signal, a portion of the sensing cells of the third sensing area produce changes with equal numerical values and same directions for a same magnetic field to be measured, and the changes have equal numerical values and opposite directions with the changes produced by another portion of the sensing cells for the same magnetic field to be measured, the two portions of the sensing cells are alternate and arranged on the third midline one-by-one and spaced from each other.

8. The magnetic sensing apparatus according to claim 1, wherein the magnetic sensing device further comprises a first operational amplifier and a second operational amplifier, the first sensing area and the second sensing area are connected to the first operational amplifier, which outputs the first output signal, the third sensing area is connected to the second operational amplifier, which outputs the second output signal.

9. The magnetic sensing device according to claim 1, wherein the first sensing area, the second sensing area, and the third sensing area consist of anisotropic magnetoresistive cells or giant magnetoresistive sensing cells or tunneling magnetoresistive cells or Hall sensing cells.

10. A magnetic sensing method for determining a distance or a speed or an angle of movement and a direction of movement of a relative motion between a magnetic sensing device and an object, the magnetic sensing device and the object having a relative motion relationship along the direction of movement, the object having a magnetic field to be measured thereon, wherein the magnetic sensing device employs a magnetic sensing device, the magnetic sensing device having a relative motion relationship with an object in a direction of movement, the object having a magnetic field to be measured thereon, the magnetic sensing device configured to sense a distance or a speed or an angle of movement and the direction of movement of the relative motion, the magnetic sensing device comprising:

a substrate having a supporting surface being parallel to the direction of movement on which a first sensing area, a third sensing area, and a second sensing area are consecutively arranged in the direction of movement, the first sensing area, the second sensing area, and the third sensing area respectively provided with a first midline, a second midline, and a third midline in the direction of movement, the first midline, the second midline, and the third midline respectively passing through midpoints of projection lengths of the first sensing area, the second sensing area, and the third sensing area in the direction of movement and being perpendicular to the direction of movement, and the first midline and the second midline being symmetrical with respect to the third midline;

wherein the first sensing area and the second sensing area are jointly configured to output a first output signal, the third sensing area is configured to output a second output signal, and a phase difference between the first output signal and the second output signal is 90 degrees, and the first output signal and the second output signal are jointly configured to determine the distance or the speed or the angle of movement and the direction of movement of the relative motion, wherein each of the first sensing area and the second sensing area includes a first sensing cell, each of the first sensing cells has a midline in the direction of movement, the midline of the first sensing cell of the first sensing area coincides with the first midline of the first sensing area, and the midline of the first sensing cell of the second sensing area coincides with the second midline of the second sensing area, the two first sensing cells produce changes with equal numerical values and same directions for a same magnetic field to be measured, the two first sensing cells are connected in series into a half-bridge structure to form a first sensor, and a connection point between the two first sensing cells outputs a first sensing signal, the first sensing signal is configured to generate the first output signal;

and wherein the magnetic sensing method comprises:

acquiring a first output signal jointly by a first sensing area and a second sensing area, acquiring a second output signal by a third sensing area, wherein a phase difference between the first output signal and the second output signal is 90 degrees, and determining the distance or the speed or the angle of movement and the direction of movement of the relative motion according to the first output signal and the second output signal.

* * * * *